United States Patent [19]

Birlain-Noris

[11] 4,284,711

[45] Aug. 18, 1981

[54] PRESENSITIZED PLANOGRAPHIC PRINTING PLATES WITH COBALT ADHESIVE LAYER

[76] Inventor: Armando Birlain-Noris, Galileo 101, Mexico City, Mexico, 5

[21] Appl. No.: 68,435

[22] Filed: Aug. 21, 1979

[51] Int. Cl.$^3$ .......................... G03F 7/02; G03C 1/94

[52] U.S. Cl. .................................. 430/276; 101/456; 430/277; 430/278; 430/302; 430/306; 430/310; 430/327; 430/524; 430/525; 430/526; 430/935

[58] Field of Search ............... 430/300, 302, 306, 310, 430/327, 524, 525, 935, 275–279, 526; 101/456, 457, 458; 204/48

[56] References Cited

U.S. PATENT DOCUMENTS

| | | | |
|---|---|---|---|
| 3,440,047 | 4/1969 | Levinos et al. | 430/277 X |
| 3,508,923 | 4/1970 | Pickard | 101/456 X |
| 3,637,381 | 1/1972 | Hallman et al. | 430/310 X |
| 3,734,732 | 5/1973 | Jones et al. | 430/310 |
| 3,860,426 | 1/1975 | Cunningham et al. | 101/456 X |
| 4,008,084 | 2/1977 | Ikeda et al. | 430/277 X |

OTHER PUBLICATIONS

Chem. Abstracts, vol. 81, 1974, 31884t, (Spanish Patent No. 418,982 to Usabiaga).

*Primary Examiner*—Edward C. Kimlin
*Attorney, Agent, or Firm*—Imirie and Smiley

[57] ABSTRACT

An improved presensitized printing plate comprises at least one metal working surface, a cobalt layer electroplated on the outer working surface of said at least one metal working surface, and a coating of light sensitive material directly deposited on said cobalt layer.

A method is also described which makes use of metallic cobalt for the preparation of presensitized printing plates in order to provide layers that are in themselves adherent to light sensitive materials without the need of using adhesives, and are useful for directly depositing light sensitive coatings thereon.

4 Claims, 5 Drawing Figures

PRESENSITIZED PLANOGRAPHIC PRINTING PLATES WITH COBALT ADHESIVE LAYER

BACKGROUND OF THE INVENTION

Broadly speaking, the present invention refers to a novel process of preparing presensitized plates by means of the use of metallic cobalt for the preparation of layers that are in themselves adherent to light sensitive materials and are useful in preparing said presensitized planographic printing plates without the need of adhesives and, more particularly, it is related to improved presensitized printing plates having as and adhesive for the light sensitive coating, a layer of cobalt applied on the outer working surface thereof.

As is well known in the art of manufacturing presensitized planographic printing plates, particularly those in which the light sensitive coating will serve as the lipophilic layer of the lithographic pair, the provision of a light sensitive coating that, while preserving its properties of ready development, will not cease to possess qualities of hardness, firm adhesion, dot fidelity and wear resistance to be useful as a lipophilic working layer in printing operations, has always been a problem of very difficult solution. In this respect, it is well known that, for optimally curing a light sensitive coating in order for it to have good qualities of hardness, firm adhesion, dot fidelity and wear resistance, it must be cured to a point which is located slightly below the lower threshold value of radiant energy which is necessary to accomplish complete polymerization or depolymerization thereof, depending on the type of light sensitive material used.

However, if a presensitized plate is sold with the light sensitive coating previously cured to the above mentioned point, said plate will show the drawback that, when applying the developer or the remover, according to the type of plate which is to be treated, these materials do not fully remove the desired areas of the light sensitive layer, because the same have been hardened to such a degree by the curing operation, that residues are always left covering and masking portions of the hydrophilic working layer.

Thus, if the sensitive coating is used when applied to an outer surface of a multimetallic printing plate wherein the hydrophilic layer is the outer layer, even when the consecutive developing and etching operations carried out on the outer metal layer of the plate may be capable of fully removing the coating affected by the developer, by entrainment with the etching fluid, the complete processing of the plate will not be efficient, because the remover which must be furtherly applied to the resist not affected by the developer in order to expose the non-etched hydrophilic metal layer, is not able to completely remove said resist, thereby leaving lipophilic residual areas that will not permit a clean operation of the printing plate.

If on the contrary, the light sensitive coating serves itself as a lipophilic layer on the outer surface of the plate, then it is the developer which will not be capable of fully removing the coating at the desired areas thereof, when the sensitive coating is directly applied on the hydrophilic surface of the plate.

The solution that has been given to such a problem of incapability of removal of the cured sensitive coating, in accordance with the prior art, is to sell the presensitized plates with the coating only partially cured or fully non-cured, thereby forcing the consumer to effect his own curing operation after developing the plate, when the coating is desired to form part of the lithographic pair, or else to accept a considerably lower fidelity. This, of course, causes serious drawbacks in the control of the curing operation of the coating and very frequently produces defective plates.

On the other hand, while in the market there are planographic plates the lipophilic layer of which is the outer layer and consequently do not offer serious difficulties in connection with the above described problem, inasmuch as the residues of the coating left by the developer at the areas affected thereby are thereafter removed by entrainment with the etching fluid, and on the other hand the residues left by the remover, if the latter is used, at the non-affected areas, by being lipophilic, are irrelevant, it has been found that adherence of the light sensitive layers or coating to said plates is not sufficiently efficient, whereby this very frequently produces a low dot fidelity when the plate is etched.

It is also well known that certain light sensitive coatings are not compatible with hydrophilic surfaces such as chromium or aluminum, whereby it has been necessary to use adhesives such as the commercial product Accobond sold by American Cyanamid, which renders production of said plates more expensive without any benefit in the operation of the plate.

Certain coatings do not show in themselves the necessary contrast against the normal working layers (chromium, copper, aluminum), whereby the prior art plates have required the addition of a pigment or dye to the coating, thereby reducing to a certain extent its sensitiveness to light in the photolytic process, consequently increasing the exposure time, which may even reach impractical levels.

it is also well known that the more commonly used hydrophilic metals for the preparation of presensitized planographic printing plates, such as chromium and aluminum, have a tendency to be oxidized and to be passivated very easily when they are not suitably protected, which brings about a considerable decrease in their hydrophilic power from the time of their electrodeposition to the time of application of the necessary light sensitive coating thereon. Therefore, it has always been regarded as absolutely inappropriate to permit that said metals be exposed to atmospheric conditions, whereby it has been required to protect them by means of layers of gum or the like or to varnish them practically immediately to avoid oxidation, which sometimes constitutes on unsurmontable disadvantage.

The above drawbacks of the prior art presensitized plates, therefore, rendered it impossible to manufacture a highly economical presensitized plate, inasmuch as heretofore it has been necessary, to provide an economical plate, in the case of, for instance, aluminum plates to which the presensitizing coating is applied, to have resort to the use or an organic adhesive for said coating or to anodization or graining processes, with the disadvantage that said plates have an unduly increased cost and a very short life and can only be used for short runs, because it is the light sensitive coating which, once developed and fixed, serves as an ink attracting layer in itself, while the metallic surface of the supporting plate serves as the ink repellent layer, whereby it will be apparent that, an organic light sensitive coating, as hard as it may be, being an organic material, cannot have a reasonably long life, which has left much to desire in connection with the production of low cost presensitized plates for wide utilization. Also, in this type of plates it is not possible to cure the coating up to the optimal point, inasmuch as the developer will leave residues on the hydrophilic aluminum surface, which might produce a deficient printing, whereby it is required that the user be the one to effect the final curing of the coating after developing the same, if a longer life is desired for the plate in use.

On the other hand, this type of drawbacks caused by the lack of adherence of the presensitizing coating on chromium layers, has rendered it impossible heretofore to economically manufacture a multimetallic positive planographic printing plate which may be presensitized with a light sensitive coating and which may have reasonable cost characteristics, inasmuch as in this particular instance it is also necessary to apply a relatively costly adhesive layer, which is also of difficult application and sometimes of low adhesive efficiency, thereby making difficult the manufacture of high quality planographic printing plates, presensitized with a light sensitive coating which may be reliable and which will enable said plates to be etched with a sufficiently high accuracy to be considered as high quality printing plates, as well as to be treated with the remover without leaving residues on the hydrophilic layer after treatment with said remover.

BRIEF SUMMARY OF THE INVENTION

It has been now surprisingly found that the application of a thin layer of cobalt on the working layers of a planographic printing plate, provides an outer layer which is highly adherent to practically all light sensitive coatings, without the need of using and adhesive resin layer or the like. The application of said cobalt layer, therefore, opens an entirely new field in the manufacture of planographic printing plates, inasmuch as it renders production of any type of planographic printing plate possible, be it non-metallic or multimetallic, with a light sensitive coating that will be of increased efficiency and will be adhered with an unusual force to the thusly applied cobalt layer, thereby rendering it possible either to manufacture very low cost plates for wide utilization or to manufacture very high quality printing plates without the need of intricate procedures.

Therefore, having in mind the defects of the prior art presensitized planographic printing plates, it is a main object of the present invention to provide a process for the preparation of presensitized printing plates, by means of the use of metal cobalt for the preparation of metal layers which will be adherent to commonly used light sensitive coatings without the need of using any type of adhesives.

It is another object of the present invention to provide a planographic printing plate which, without the need of using organic adhesives, will render it possible to firmly adhere a light sensitive layer to provide for a highly efficient presensitized plate.

It is one further object of the present invention to provide a presensitized planographic printing plate of the above mentioned character, which will have an increased fidelity in dot reproduction in the process of photographic transport.

It is a more particular object of the present invention to provide a presensitized planographic printing plate of the above mentioned character, which will permit curing of the light sensitive coating in the factory, up to its optimal curing point without thereby causing undue adherence problems of the coating on the hydrophilic working surfaces after the developing and/or removal of said light sensitive coating.

It is a further object to the present invention to provide a presensitized planographic printing plate of the above mentioned character, which will be a very low cost plate while having an increased printing efficiency.

Still one other object of the present invention is to provide a presensitized planographic printing plate of the above identified character, which will be a high printing quality multimetal plate and will however have a relatively low cost.

Another object of the present invention is to provide a presensitized planographic printing plate of the above mentioned character, which will avoid all possibility of passivation and/or oxidation of the hydrophilic metals used on the surface thereof.

BRIEF DESCRIPTION OF THE DRAWINGS

The novel features that are considered characteristic of the present invention are set forth with particularity in the appended claims. The invention itself, however, both as to its organization and its method of operation, together with additional objects and advantages thereof, will best the understood from the following description of certain specific enbodiments, when read in connection with the accompanying drawings, in which:

DETAILED DESCRIPTION

Stated in broad terms, the present invention resides on the surprising discovery that electroplated metal cobalt layers show the characteristic of having a high adhesive power with respect to light sensitive coatings and that said electroplated cobalt layers show the advantages of having a high retentiveness of the fatty organic materials such as the ink used in the lithographic printing processes, whereby they may serve as ink retaining layers and water rejecting layers in order to from one of the elements constituting the lithographic pair of a planographic printing plate.

The above properties shown by electroplated cobalt metal layers permit the preparation of presensitized planographic printing plates wherein utilization of an adhesive resin layer of practically uncontrollable and difficult application is unnecessary for adhering the light sensitive coating, necessary for producing a long life presensitized plate, unto the outer surface of a plate formed by one or more metals.

The above obviously opens a broad field for utilization of electroplated metal cobalt layers in connection with the graphic arts, inasmuch as practically any monometallic or multimetallic planographic printing plate may be converted into a presensitized plate with almost any type of light sensitive coating and with a maximum of safety and control.

Thus, having now more particular reference to the accompanying drawings, there are shown several embodiments of planographic printing plates to which, as a final working layer, a layer of electroplated cobalt has been added to serve for providing a finished plate with characteristics of high adherence with respect to light sensitive organic coatings like those commonly used for the production of presensitized printing plates. It must be pointed out, however, that the accompanying drawings and the detailed description which will be given hereinbelow, are only exemplifying but not limitating of the scope of present invention, which essentialy resides on the new use of cobalt applied on any type of planographic printing plate, regardless of the specific construction of said plate.

Figure 1:
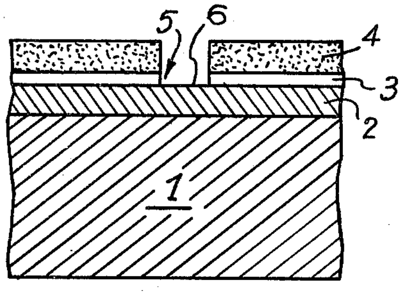
FIG. 1 is a cross sectional diagrammatic view of a presensitized planographic bimetal printing plate with part thereof already developed and etched, and built in accordance with a particularly preferred embodiment of the present invention.

More particularly having reference to FIG. 1 of the drawings, there is shown a bimetal plate (without considering the cobalt layer of the instant application) having improved economical characteristics and being adapted to be used in lieu of the traditional presensitized printing plates comprising an aluminum or zinc base plate to which the light sensitive coating layer is adhered, and comprising particularly a steel base plate 1, on which a working chromium layer 2 has been electroplated, on which in turn there is directly electroplated a thin cobalt layer 3 to which the light sensitive resin coating 4 is directly adhered in order to produce a presensitized plate having a relatively reduced cost and however being of a considerably increased life as compared to the traditional aluminum or zinc plates.

The plate built in accordance with the embodiment illustrated in FIG. 1 of the drawings may be prepared by the lithographic process to be used directly in printing operations, either as a negative plate if the coating is polymerized and insolubilized when exposed to light, or as a positive plate if the coating is depolymerized and solubilized when exposed to light, by means of the exposure of the light sensitive coating 4, through a suitable transparency and thereafter developing the coating to remove those portions thereof that were affected by the developer after light exposure, such as illustrated in 5 in said Figure. Thereafter, the plate is etched by means of a suitable etching fluid to remove the cobalt layer 3, to thereby uncover through the developed surface 5, the plain and smooth surface of the chromium layer 2, such that the necessary lithographic pair is formed by surface 6 of the chromium layer which is ink repellent and water attracting and the surface of the coating 4 which is in itself ink attracting and water repellent.

In use, it may be clearly seen that this novel planographic bimetallic printing plate has a highly increased life as compared to the traditional aluminum or zinc presensitized plates, inasmuch as, when the sensitive coating 4 is completely worn out, because the latter is of a low duration by being an organic layer, then the surface of the cobalt layer 3 will continue to operate as a layer capable of forming the necessary lithographic pair with the surface 6 of the chromium layer 2, because the cobalt layer of the present invention shows properties of attracting ink and repelling water, which are sufficient in themselves to provide said cobalt layer with the characteristic of serving as one of the elements of the lithographic pair necessary for printing operations. Therefore, when in use the coating 4 has been worn out, the plate will continue to operate through the utilization of the surface of the cobalt layer 3 in association with the uncovered surfaces 6 of the chromium layer 2 thereby forming the necessary lithographic pair to continue the printing operation for a very long period as compared to periods of time available with the prior art plates that are only formed by an aluminum or zinc base plate which is ink repellent, and a light sensitive coating which is water repellent and that, consequently, when worn out, which occurs in a short time, are rendered useless for continuing the lithographic printing process.

Figure 2:
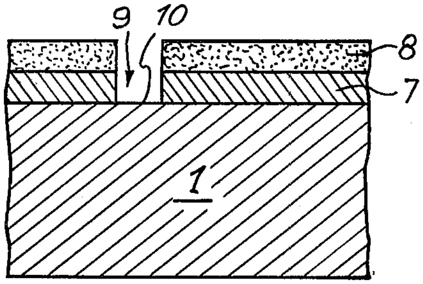
FIG. 2 is a view similar to FIG. 1, but showing a presensitized planographic monometallic printing plate built in accordance with a second embodiment of the present invention.

Having now reference to FIG. 2 of the drawings, there is illustrated a monometallic plate (without considering the cobalt layer which forms the subject matter of this invention), which may basically be used also in lieu of the prior art presensitized aluminum or zinc plates previously described, but in which the coating may be cured to its optimal condition, contrary to what was necessary in the prior art plates, in which the final curing of the coating must be effected, if longer runs are desired, after developing said coating. The monometallic plate of FIG. 2 comprises an aluminum base plate 1, which will serve to provide the hydrophilic surface, and on which there is electroplated a cobalt layer 7 in accordance with this invention. On said cobalt layer 7, there is applied a light sensitive coating 8, which coating may be cured in an oven to its final curing point, in order to produce a presensitized plate that will not require additional curing by the consumer and user thereof.

The plate in accordance with the embodiment illustrated in FIG. 2 is prepared in a manner similar to that described in connection with FIG. 1, and it may be pointed out that any residue of coating remaining on the cobalt surface after developing the coating to form the recess 9, will be removed when the cobalt layer 7 is etched, thereby leaving faithfully and fully uncovered the areas 10 of the surface of the aluminum base 1 to serve as the hydrophilic element of the plate while the coating 8 serves as the lipophilic element of the lithographic pair.

The advantages shown by this plate are, in addition to those already described, equivalent to those possessed by the plate built in accordance with the embodiment of FIG. 1, whereby it is considered unnecessary to repeat the same.

It may be seen from the above that the properties of the cobalt layers of the present invention render it possible to obtain planographic printing plates that, besides avoiding the use of an adhesive for the light sensitive coating, provide the peculiarity that, when said light sensitive coating is worn out in use, the cobalt layer itself applied superficially to said plates, will continue to work as one of the elements of the lithographic pair, thereby considerably increasing the length of the printing runs that may be accomplished with said plates, contrary to what occurs with the prior art plates wherein, once the light sensitive coating is worn out, they do not provide any possibility of continuing the printing run.

Figure 3:
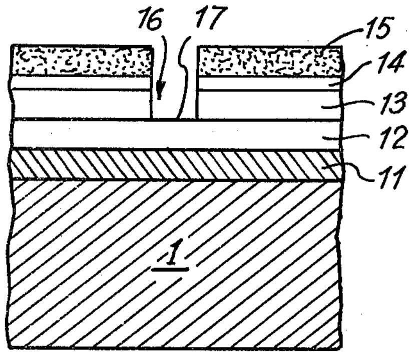
FIG. 3 is a view similar FIG. 1 but showing a presensitized positive planographic multimetallic printing plate built in accordance with a third particularly preferred embodiment of the invention and showing a portion thereof already developed and etched.
Figure 4:
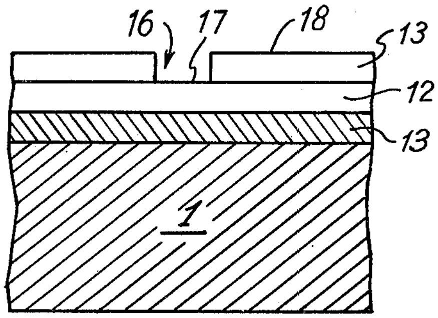
FIG. 4 is a view of the same plate shown in FIG. 3 but with the upper layers removed to provide the final printing plate.

The above properties of the cobalt layers in accordance with the present invention render it also possible to obtain multimetal planographic presensitized printing plates such as that illustrated by the planographic positive trimetal printing plate (without considering the cobalt layer of the present invention) shown in FIGS. 3 and 4 of the drawings.

In said FIGS. 3 and 4 of the drawings there is shown a positive trimetal printing plate which is formed by a base plate 1 built of either steel or any other suitably treated material to render it capable of receiving thereon an electroplated working layer which, in the particular embodiment illustrated, comprises an alkaline copper layer 11 electroplated on the base plate 1, and an acid copper layer 12 applied on the alkaline copper layer 11, to form one of the elements of the lithographic printing pair. On the copper layer 12 there is applied in a manner known per se, a chromium layer 13 which completes the printing lithographic pair, and on the surface of said chromium layer 13, there is applied the cobalt layer 14 of the present invention, to receive thereon directly the light sensitive coating 15, which will be firmly adhered in such a way to the positive trimetal printing plate, that will enable production of a finished presensitized plate for positive or negative work, depending on the type of coating used and that may be sold without any further treatment.

In order to prepare the positive trimetal printing plate built in accordance with the embodiment illustrated in FIG. 3 of the drawings, such as is well known in the art, the light sensitive coating 15 is exposed to light through a suitable transparency and thereafter said light sensitive coating is developed by means of a suitable developer, in order to remove the coating at the desired areas, which are identified by means of the general reference numeral 16 in FIG. 3 of the drawings. The cobalt and chromium layers 14 and 13, respectively, are thereafter etched in order to remove said layers in the areas 16 from which the light sensitive coating 15 has been previously removed by means of the developing operation, in order to directly uncover the surface 17 of the copper layer 12 for forming one of the elements of the lithographic pair and more particularly the ink attracting element thereof.

In order to leave the complete copper-chromium lithographic pair duly uncovered for utilization of the trimetal printing plate as is well known in the graphic arts, the coating 15 and the cobalt layer 14 are removed by the use of a remover for light sensitive coatings which is of a well known nature in the graphic arts and by means of the further utilization of a suitable etching fluid for cobalt, which will leave the uncovered surface 18 of the chromium layer 13 unaffected and which will not affect the exposed surfaces 17 of the copper layer 12, so that a trimetal planographic printing plate as illustrated in FIG. 4 of the drawings is obtained, merely comprising the base 1, the alkaline copper layer 11 and the working copper and chromium layers 12 and 13, respectively, forming the conventional lithographic pair between the uncovered surfaces of copper 17 and chromium 18.

Figure 5:
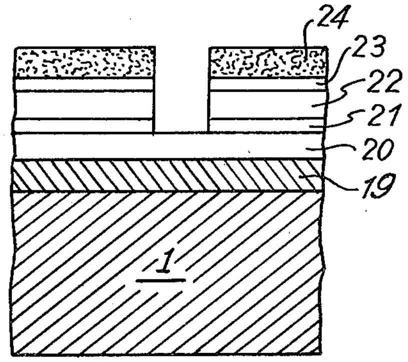
FIG. 5 is a view similar to the above figures but showing a presensitized planographic multimetallic negative printing plate built in accordance with a fourth particularly preferred embodiment of the present invention.

Also, the properties of the cobalt layers of the present invention may be taken advantage of for preparing negative multimetal planographic printing plates having a high printing quality, such as that particularly illustrated in FIG. 5 of the drawings, wherein there is illustrated a multimetal negative printing plate comprising substantially a base 1 made of steel or of any other material suitably prepared to receive electroplated metal layers on its surface, to which a first copper layer 19, preferably of alkaline copper, is applied in order to provide for the adherence to said plate of the first working layer 20 which is an electroplated chromium layer, on which a very thin layer of nickel or cobalt is applied, as indicated by means of the reference numeral 21, for supplying sufficient adherence for the next working layer 22 made a copper which otherwise would not be firmly adhered to the chromium layer 20 such as is well known in the art. As mentioned above, the copper layer 22 is made of high quality acid copper for forming one of the elements of the lithographic pair eventually and is applied by electroplating said layer on the nickel or cobalt layer 21. Finally, on said copper layer 22 there are applied the cobalt layer 23 and the light sensitive coating 24 in accordance with the provisions of the instant invention, in order to obtain a multimetal negative printing plate having a very high printing quality and being of presensitized nature.

In order to develope the multimetal negative printing plate in accordance with the embodiment illustrated in FIG. 5, such as is well known in the art, the light sensitive coating 24 is exposed to light through a suitable transparency, to thereafter develope the same and remove certain portions of said light sensitive coating as illustrated in 25 in FIG. 4 of the drawings and, thereafter, the cobalt layer 23, the copper layer 22 and the cobalt or nickel layer 21 are simultaneously etched in order to uncover certain areas 26 of the surface of the chromium layer 20, which will form one of the elements of the lithographic pair in accordance with the embodiment illustrated in FIG. 5.

The plate may be used directly after etching the cobalt layer 23, the copper layer 22 and the cobalt or nickel layer 21, inasmuch as the other element of the lithographic pair will be initially formed by the light sensitive coating 24 which, when worn out, will leave exposed on the surface of the plate the cobalt layer 23, which will continue to operate as an ink attracting element of the lithographic pair and, furthermore, after a very long utilization of the plate, when the cobalt layer 23 is worn out, then the surface of the copper layer 22 will remain exposed to the outside and will continue to operate as an ink attracting element of the lithographic pair, whereby these multimetal negative printing plates have a considerably increased life in view of the fact that, even after wearing out completely the coating 24 and the cobalt layer 23, said plates will still have the copper layer 22 which is of a very long life and will continue to operate as the ink attracting element of the lithographic pair in conjunction with the exposed surfaces 26 of the chromium layer 20 which is underneath and that will act as the water attracting and ink repellent element of said lithographic pair.

As it will be clearly seen from the above, the cobalt layers in accordance with the present invention may have application in connection with any type of planographic printing plates and said cobalt layers may be very thin, inasmuch as their essential purpose is to provide a suitable adherence of the working layers, either of aluminum or chromium or copper, towards the light sensitive coatings, as well as efficient protection for said layers from the time of their electroplating or preparation on the plates, to the time in which they receive the light sensitive coating.

While there are many alternatives to accomplish deposition of cobalt layers in accordance with the present invention and it is not desired to be bound to any embodiment of process or cobalt plating bath for the electrolytic deposition of said cobalt layers, according to a particularly preferred embodiment of the invention, it is preferred to deposit said cobalt layers from a bath substantially comprising hexahydrated cobalt chloride, boric acid and hydrochloric acid, the cobalt layer been applied by dipping the printing plate in the bath as a cathode and by incorporating carbon or cobalt anodes within the above mentioned bath, applying a voltage of from about 3 to 16 volts and a current of from 100 to 600 amperes, to produce a current density of 1.4 to 8.7 amperes/$dm^2$ and at an electrolyte temperature of from about 20° to 60° C., thereby achieving a very efficient cobalt deposition either on aluminum, copper or chromium surfaces in accordance with the present invention.

The electrolytic bath for the deposition of cobalt layers in accordance with the present invention preferably contains from 50 to 100 g/liter of hexahydrated cobalt chloride, from 5 to 25 g/liter of boric acid and from 4 to 25 ml/liter of 37.8% hydrochloric acid, thereby achieving a very effective cobalt deposition in accordance with the present invention, said bath being operated under the conditions of current density and temperature mentioned above.

More particularly, it is preferred to use an electrolytic bath for the deposition of cobalt layers in accordance with the present invention either on chromium or copper layers or on aluminum plates, that comprises 75 g/liter of hexahydrated cobalt chloride, 13.5 g/liter of boric acid and 10.2 ml/liter of 37.86% hydrochloric acid, this bath being the optimal bath for accomplishing a cobalt deposition at a lower cost and with a maximum of efficiency.

From the above it will be seen that for the first time a very important technological advance has been produced in connection with the adhesion of light sensitive coatings on planographic printing plates, without the need of using an organic adhesive layer which is in itself of difficult and insecure application and of no usefulness whatsoever in connection with the graphic arts, while at the same time there have been provided presensitized planographic printing plates that may be of a very low cost and a remarkably extended life as compared to equivalent plates of the prior art. The present invention is also highly useful for any type of planographic printing plates but finds a still more important usefulness in connection with planographic printing plates in which the lipophilic layer is superposed to the hydrophilic layer, inasmuch as the cobalt layers in accordance with the present invention, besides constituting highly adherent layers for light sensitive coatings, also constitute ink attracting elements that render it possible to continue utilization of the presensitized plates even after all the light sensitive coating initially serving as said ink attracting element of the lithographic pair of the printing plates, has been fully worn out.

It will be clearly apparent to any one skilful in the art that the plates to which the cobalt layers in accordance with the present invention are applicable, may be of any nature, either monometallic, bimetallic, trimetallic or multimetallic and that said plates may be either positive or negative and may be prepared in accordance with any known technique, inasmuch as the construction of the plate itself does not form integral part of the present invention, which essentially resides on the application, to any one of such plates, of a cobalt layer and a light sensitive coating to convert them into presensitized plates in accordance with the present invention.

It will also be apparent that the base plate illustrated in the drawings may be replaced by a base plate of any other metal or of any other organic material such as a plastic resin, suitably treated to receive metal layers by electroplating, without thereby departing from scope and spirit of the invention.

Although certain specific embodiments of the present invention have been shown and described, it is to be understood that many modifications thereof are possible. The invention, therefore, is not to be restricted except insofar as is necessitated by the prior art and by the spirit of the appended claims.

What is claimed is:

1. A presensitized planographic printing plate comprising a base sheet consisting essentially of an aluminum sheet, the metal working surface thereof for forming at least one of the elements of the lithographic printing pair, a presensitizing coating, and metallic adhesive means comprising a thin cobalt metal layer electroplated on said metal working surface for serving as an adhesive for said presensitizing coating;

said presensitizing coating being an organic light sensitive coating directly applied on said adhesive cobalt layer, such that the use of any organic adhesive between the metal working surface and said presensitizing coating is avoided.

2. A presensitized planographic printing plate comprising a base sheet consisting essentially of a steel sheet and a metal working surface thereon comprising the surface of a chromium layer electroplated on said steel sheet;

a presensitizing coating; and metallic adhesive means comprising a thin cobalt metal layer electroplated on said metal working surface for serving as an adhesive for said presensitizing coating;

said presensitizing coating being an organic light sensitive coating directly applied on said adhesive cobalt layer, such that the use of any adhesive between the metal working surface and said presensitized coating is avoided.

3. A presensitized planographic printing plate comprising a base sheet consisting essentially of a steel sheet, a copper layer superimposed on said steel sheet, and a chromium layer superimposed on said copper surface, the surfaces of said superimposed copper and chromium layers being a metal working surface;

a presensitizing coating; and metallic adhesive means comprising a thin cobalt metal layer electroplated onto the surface of the outer chromium layer for serving as an adhesive for said presensitizing coating;

said presensitizing coating being an organic light sensitive coating directly applied on said adhesive cobalt metal layer, such that the use of any organic adhesive between the metal working surface and said presensitizing coating is avoided.

4. A presensitized planographic printing plate comprising a base sheet consisting essentially of a steel sheet, a superimposed chromium layer on the surface of said steel sheet, a copper layer superimposed on the chromium layer, said superimposed chromium and copper layers comprising a metal working surface for forming at least one of the elements of the lithographic printing pair;

a presensitizing coating; and metallic adhesive means comprising a thin cobalt metal layer electroplated on the surface of the outer copper layer for serving as an adhesive for said presensitizing coating;

said presensitizing coating being an organic light sensitive coating directly applied on said adhesive cobalt metal layer, such that the use of any organic adhesive between the metal working surface and said presensitizing coating is avoided.

* * * * *